United States Patent [19]

Tabatabaie-Alavi et al.

[11] Patent Number: 4,494,995
[45] Date of Patent: Jan. 22, 1985

[54] DUAL SPECIES ION IMPLANTATION OF TERNARY COMPOUNDS BASED ON IN-GA-AS

[75] Inventors: Kamal Tabatabaie-Alavi, Cambridge; Abu N. M. M. Choudhury, Belmont; Nancy J. Slater Gabriel, Cambridge; Clifton G. Fonstad, Arlington, all of Mass.

[73] Assignee: The United States of America as represented by the Secretary of the Navy, Washington, D.C.

[21] Appl. No.: 471,083

[22] Filed: Mar. 1, 1983

[51] Int. Cl.$^3$ .................. H01L 21/265; H01L 29/48; H01L 29/56
[52] U.S. Cl. .................. 148/1.5; 29/576 B; 148/187; 357/61; 357/63; 357/91
[58] Field of Search ............ 148/1.5, 187; 29/576 B; 357/91, 61, 63

[56] References Cited

U.S. PATENT DOCUMENTS 4,312,681 1/1982 Rupprecht et al. ............ 148/1.5
4,377,030 3/1983 Pettenpaul et al. ............ 29/576 B
4,385,938 5/1983 Park et al. ...................... 148/1.5

OTHER PUBLICATIONS

Vescan et al., Electronics Letters, 18 (Jun. 1982) 534.
Kawata et al., Jap. Jour. Appl. Phys. 21 (Jul. 1982), L-431.
Stoneham et al., Jour. Electronic Materials, 9 (1980) 371.
McLevige et al., Jour. Elec. Materials, 7 (1978) 547.
Kwun et al., J. Appl. Phys. 54 (1983) 3125.
Brozel et al., Jour. Crystal Growth—50 (1980) 619.
Pedrotti et al., J. Appl. Phys. 51 (1980) 5781.
Yeo et al., J. Appl. Phys. 51 (1980) 5186.
Stolte in Ion Implantation in Semiconductors, ed., Chernow et al., Plenum, N.Y., p. 149, (1976).
Ploog et al., J. Electrochem. Soc. 128 (1981) 400.
McNally, P. J., Radiation Effects, 6 (1970) 149.

Primary Examiner—Upendra Roy
Attorney, Agent, or Firm—Robert F. Beers; Arthur A. McGill; Prithvi C. Lall

[57] ABSTRACT

A method for Ion implantation using multiple energy Be$^+$ to produce p-type regions in n-In$_{0.53}$Ga$_{0.47}$As. A simple technique is used to develop capless annealing of InGaAs up to 700° C. The ion implantation of silicon is then accomplished to create n$^+$ layers in previously Be-implanted InGaAs epilayers. The active efficiency of 40% for 50 KeV Be implant has been found and efficiencies of 86% and 38% are found for the low and high energy Si implants respectively.

5 Claims, 6 Drawing Figures

DUAL SPECIES ION IMPLANTATION OF TERNARY COMPOUNDS BASED ON IN-GA-AS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

Subject invention is related to the field of microelectronics and more particularly to ion-implanted dopants for ternary compounds.

(2) Description of the Prior Art

The ternary compound $In_{0.53}Ga_{0.47}As$ has received much attention in recent years due to its high mobility and sufficiently large gap to allow room-temperature operation of many devices as discussed in Pearsall's article in IEEE J., Quantam Electron QE-16, 709 (980) which is incorporated herein by reference. However, to utilize the full potential of this material in high speed transistors, it is desirable to develop an easily controllable and reproducible means of producing n-type and p-type regions by ion implantation. Be+ ion implantation has been extensively used in the prior art to create p-layers in III-V compounds. However, the Be+ ion implantation of InGaAs has not been accomplished so far. It is thus desirable to have a technique by which Be+ ion implantation can be accomplished in a ternary compound such as InGaAs. Furthermore, it is also desirable to produce ion implantation of silicon to create n+ layers in already Be+-ion implanted InGaAs epilayers.

SUMMARY OF THE INVENTION

Ion implantation of dopants such as Be+ and silicon for ternary compounds such as InGaAs is accomplished according to the teachings of subject invention. Subject technique uses two schedules; a "low" dose implant for creating a deep player and a "high" dose implant to create a shallow p+ layer. The implants were annealed by sandwiching the samples between two pieces of mechanically lapped InAs polycrystals and annealed under a forming gas (a mixture of argon and hydrogen) atmosphere. The Be implanted InGaAs were then ion implanted with silicon to create n+ layers. The subject technique produces activation efficiency of 40% for 50 KeV Be+ dopant and activation efficiencies of 86 and 38% for the low and high energy Si implants respectively.

An object of subject method is to have a technique of ion implanting dopants such as Be+ in a ternary compound such as InGaAs.

Another object of subject invention is to obtain Be+ ion implantation in ternary compound InGaAs prepared by using liquid phase epitaxy (LPE).

Still another object of subject invention is to use different dose implants for creating different types of p-layers.

Still another object of subject invention is to accomplish Be ion implantation to produce p-type In regions suitable for the basis of npn planar transistors.

Still another object of subject invention is to produce ion implantation of Si to create n+ layers in the already Be+ ion implanted InGaAs epilayers.

Other objects, advantages and novel features of the invention will become apparent from the following detailed description of the invention when considered in conjunction with the accompanying drawings wherein:

DESCRIPTION OF THE PREFERRED EMBODIMENT

The technique of implanting dopants in ternary compounds according to the teachings of subject invention is accomplished by using InGaAs layers of thickness 3 micrometer (1 $\mu m = 10^{-6}$m) grown on (100) oriented S-doped and semi-insulating InP substrates by using well known technique of liquid phase epitaxy (LPE). The layers have a background of carrier concentration of $1-2 \times 10^{+16}$ cm$^{-3}$ and an electron Hall mobility of 8700 cm$^2$/V-sec.

Two implant schedules were used: a "low" dose implant for creating a deep-player and a "high" dose implant to create a shallow p+ layer. These two implant dose schedules are shown as detailed in Table 1 below:

TABLE 1

| Schedule (Be+) | Implant No. | Energy (keV) | Dose × $10^{-13}$ cm$^{-2}$ |
|---|---|---|---|
| Low dose | 1 | 50 | 0.89 |
| | 2 | 120 | 1.50 |
| | 3 | 280 | 2.30 |
| High dose | 1 | 50 | 5.35 |
| | 2 | 120 | 9.2 |

The high and low implants were similar to those used in forming the extrinsic and intrinsic base regions of Si bipolar transisor. The substrates were nominally at room temperature during the implantation process. However, the substrates can also be at other temperatures during the implantation.

Figure 1:
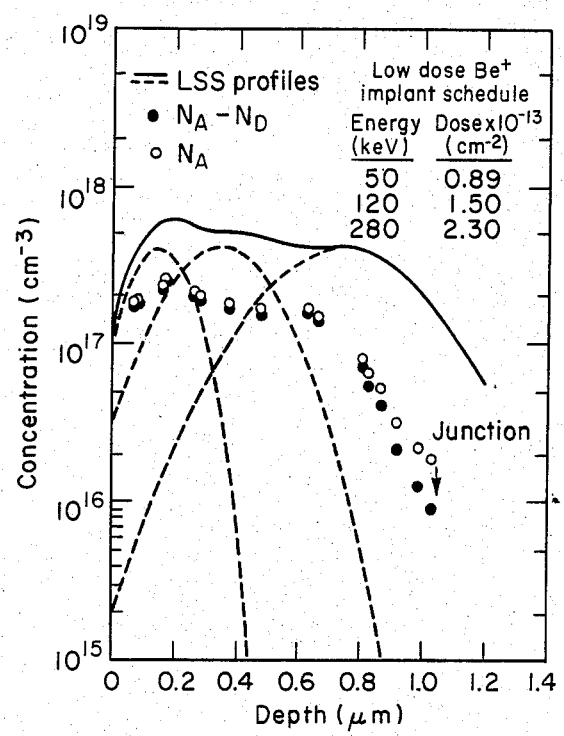
FIGS. 1 and 2 are graphical representations of the implant profile for the low dose implant and high dose implant schedules respectively.
Figure 2:
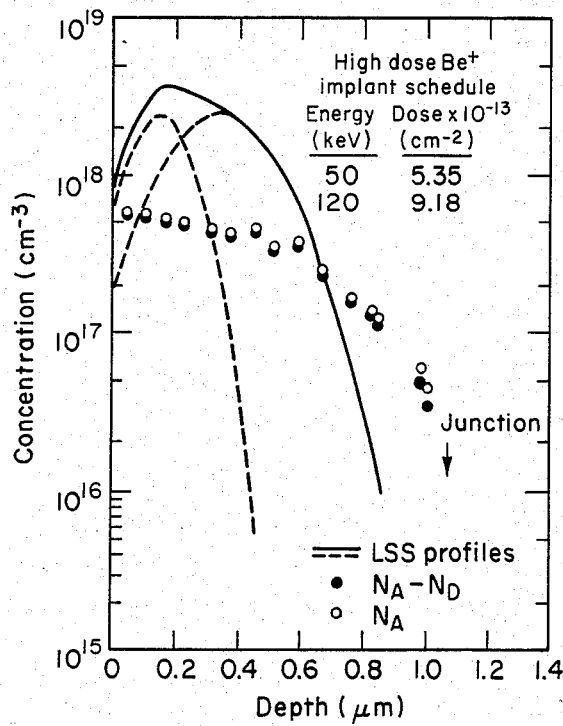

The implants were annealed by having the implanted samples sandwiched between two pieces of mechanically lapped InAs and annealed under a forming gas (a mixture of argon and hydrogen) atmosphere at 670° C. for 10–15 minutes. C-V measurements on Au Schottky diodes were used to determine the implanted Be+ profile. To minimize the effect of series resistance, the capacitance between the 100 $\mu$m-diameter circle and a surrounding ring with a 120 $\mu$m inner diameter and 500 $\mu$m outer diameter was measured. The measurement was carried out at 100- and 500-kHz; the difference between the capacitance values measured at the different frequencies was less than 3%. To reduce the edge effect contribution, the maximum depletion region width was kept under 2000 Å (1 Å=$10^{-10}$ meter). For the high dose implanted samples, the C-V measurements had to be done at liquid-nitrogen temperature to reduce the excessive room temperature leakage current of Schottky diodes. A Schottky barrier height of 400 meV (1 meV=$10^{-3}$e.V) was deduced from the C-V measurements. To profile the implant, the gold was removed, the InGaAs was etched in a solution of 100 cc:2 cc:1 cc $H_2SO_4$, $H_2O$, $H_2O_2$ (etch rate of 1600 Å mim) to remove approximately 400 Å, the gold pattern was reapplied with the C-V measurement was repeated. This etch-metallization-profile sequence was repeated several times to profile the complete implant layer. After each etching to determine the etch depth, smoothness and flatness of the etched surface was checked using standard Nomarski interence microscopy. The resulting profiles are shown in FIGS. 1 and 2 for the low dose- and high dose-implant schedules respectively. The dark dots are the net acceptor concentration $N_A-N_D$, and the open circles are acceptor concentration $N_A$ obtained by subtracting the background donor concentration $N_D$. $N_D$ (approximately $10^{16}$ cm$^{-3}$) was determined from a Hall measurement made on an unimplanted InGaAs epilayer grown on a semi-insulating substrate.

The Hall mobility in the p-type implanted region was measured using a 1 µm-thick layer of InGaAs grown on semi-insulating InP. This layer was implanted with Be+ ions following the low schedule and annealed as described above. A room-temperature Hall mobility of 100 cm²/V-sec was measured on the sample.

Figure 3:
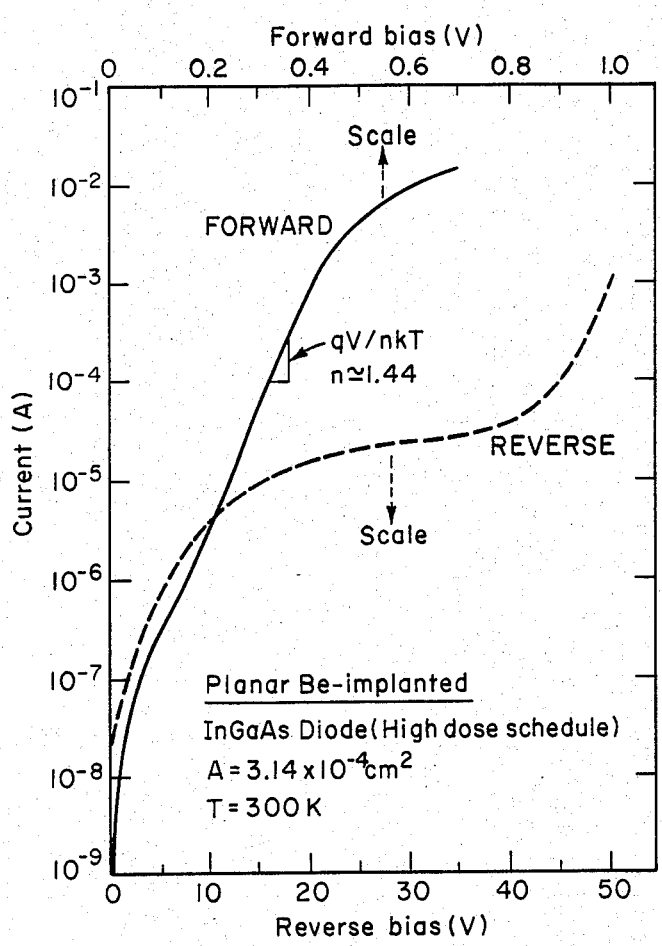
FIG. 3 is a graphical representation of the forward and reverse current-voltage (I-V) characteristics of Be-implanted planar p-n diodes under high dose implant schedule.
Figure 4:
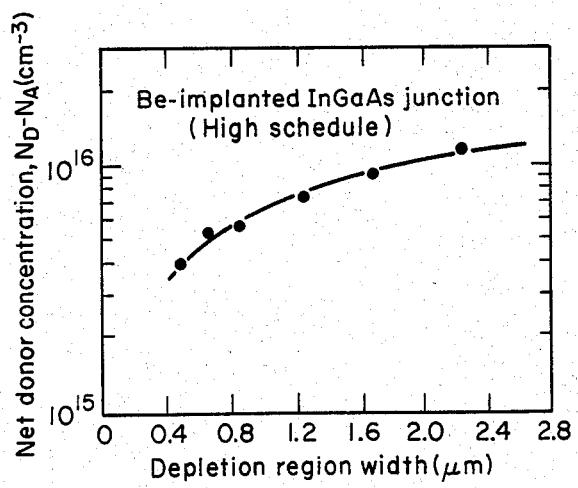
FIG. 4 represents graphically net donor concentration in the vicinity of the junction of the diodes measured in FIG. 3.

200 µm-diameter planar diodes were formed by using a 1 µm-thick film of plated gold as the implantation mask. Be+ was implanted following the high dose implant schedule. After implantation, the gold was etched away and the samples were annealed as described above. Au/Zn/Au was plated on the implanted region to form ohmic contact to the p-type material, using the technique explained in our co-pending patent application Ser. No. 471,098 and filing date of Mar. 1, 1983, and issued as U.S. Pat. No. 4,414,076 on Nov. 8, 1983. The current-voltage data for these diodes is shown in FIG. 3. The net ionized impurity profile ($N_D-N_A$) in the vicinity of the junction deduced from capacitance-voltage (C-V) measurements on these implanted p+-n diodes is shown in FIG. 4. As mentioned earlier, the profiles are shown in FIGS. 1 and 2 for the low and high dose implant schedules respectively. The solid curve is the profile expected from Lindhard-Scharff-Schiott (LSS) theory. The dashed curves are the individual implant profiles (see Table 1) predicted by LSS theory. The total activation efficiency determined by integrating the area under the dark circles is 32% of the low dose implant schedule as shown in FIG. 1. It is possible to estimate the activation efficiency of individual implants. The 50-, 120-, and 280-keV implants were found to have activation efficiency of approximately 40, 34 and 15% respectively. Ion implantation of silicon was used to create n+ layers in the already Be-implanted InGaAs epilayers as described above. A peak electron concentration of $7\times10^{18}$ cm$^{-3}$, a sheet resistance of 28 ohm per square and average electron mobility of 300 cm²/Vsec have been measured in layers implanted with doses of $5.6\times10^{13}$ cm$^{-2}$ and $14\times10^{13}$ cm$^{-2}$ at 100 and 250 keV respectively. Ion implantation was used to produce p-type InGaAs regions suitable for the bases of npn planar transistors. Layers of n-type ($N_D-N_A=1-2\times10^{16}$ cm$^{-3}$, µ$_{300}$=8000 cm²/Vsec). $In_{0.5}$-$_3Ga_{0.47}As$ layers 1 micrometer (1 micrometer=1 µm=$10^{-6}$ meter) thick were grown on semi-insulating InP substrates by liquid phase epitaxy (LPE). Be and Si were then successfully implanted in the layers nominally at room temperature. The schedule followed for Be & Si implantation is given in Table 2 below:

TABLE 2

| Implanted ion | Energy (keV) | Dose × $10^{13}$ cm$^{-2}$ |
|---|---|---|
| Be+ | 50 | 0.89 |
|  | 120 | 1.5 |
|  | 280 | 2.3 |
|  | 100 | 5.6 |
| Si+ | 250 | 14 |

Specimens implanted with Be as described above were proximity cap annealed by sandwiching them between two InGaAs substrates and heating them in a forming gas (a mixture of argon and hydrogen) atmosphere at 670° C. for 15 minutes. The carrier concentration and mobility of the silicon implanted n+ layer was profiled using differential Hall measurements. After each Hall measurement, 400 Å of InGaAs was removed by etching in a solution of $H_2SO_4$, $H_2O$, and $H_2O_2$ (100:2:1 by volume) for 15 seconds and the measurement was repeated. Measurements on a control sample etched simultaneously with the Hall sample were measured to determine the thickness of the layer etched off, and to check that the etched surface remained flat and smooth. Once the n+ silicon implanted layer had been completely removed, the profile underlying p beryllium implanted layer was checked using Schottky barrier C-V measurements.

Figure 5:
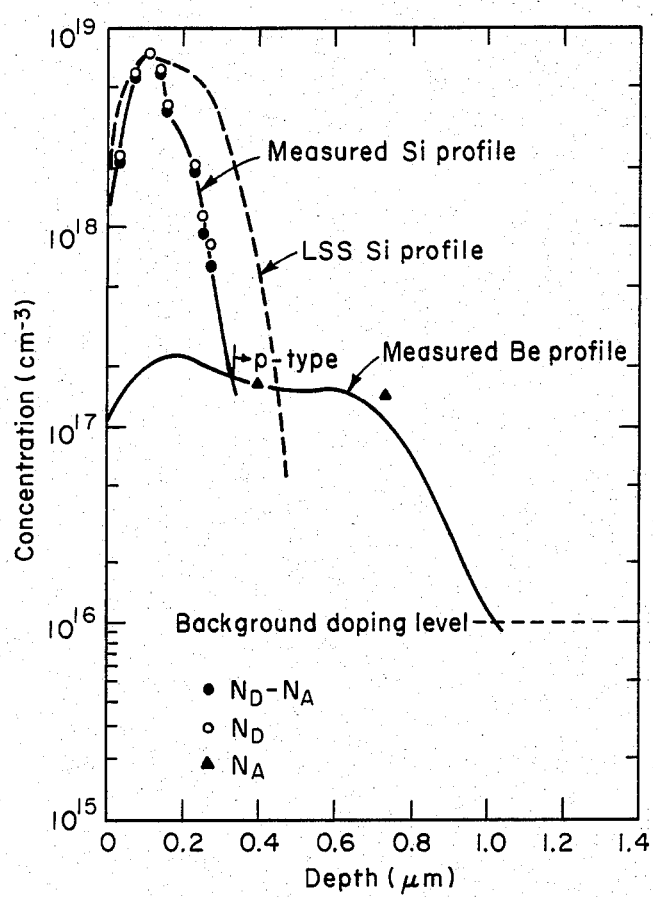
FIG. 5 is a doping profile measured on a Si-implanted InGaAs epitaxial layer previously implanted with Be.

The measured doping profile of the silicon implants is shown in FIG. 5. The solid and open circles are $N_D-N_A$ and $N_D$ respectively. The solid curve is the Si profile predicted by Lindhard-Scharff-Schiott (LSS) theory. The dashed curve is the p-type Be implant profile determined from C-V measurements on samples with no Si implant. The two solid triangles are $N_A-N_D$ determined from C-V measurements made on Schottky barriers on the underlying p-type Be implanted layer after the Si region has been totally etched away.

Figure 6:
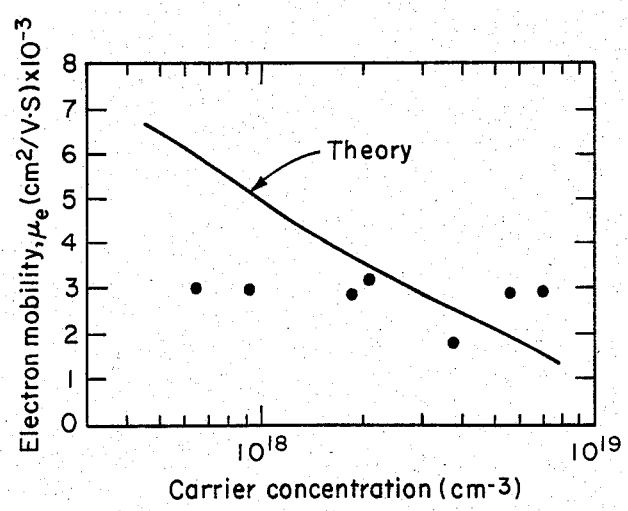
FIG. 6 is a plot of electron Hall mobility of the Si-implanted n+ layers of already Be-implanted InGaAs.

The electron Hall mobility of the Si implanted n+ layer is plotted as a function of the carrier concentration as shown in FIG. 6 wherein the solid line is taken from Pearsall's theoretical calculation of the electron mobility in InGaAs.

The electron mobility of the Si-implanted layer is in fair agreement with the values predicted theoretically for good quality bulk material. The mobilities measured in the lower concentration regions, i.e., $N_A$ less than $10^{18}$ cm$^{-3}$ were lower than expected. This data comes from the region which has been doped by the 250 keV implant. The lower mobility in this region of the profile coupled with the 50% lower activation of the 250 keV implant compared to the 100 keV implant may be indicative of damage remaining from the 250 keV implant.

Briefly stated, a Be+ ion implantation in InGaAs has been accomplished for different implant energy and doses. A simple proximity cap annealing technique has been used for annealing of InGaAs and good activation is achieved. Planar diodes were fabricated by Be+ ion implantation in InGaAs showing an ideality factor of .1.5 and a breakdown voltage of 50 V. Silicon was implanted on Be-implanted InGaAs epilayers to create an n+-p-n structure. A peak electron concentration of $7 \times 10^{18}$ cm$^{-3}$, sheet resistance of 28 ohms per square and average electron hall mobility of 300 cm$^2$/Vsec have been achieved in the silicon implanted n+ layer. Higher annealing temperatures and implanting at 200° C. are expected to further increase the activation inefficiencies and carrier mobility.

Modifications and variations of the present invention are possible in the light of above teachings. As an example, substrates of varying thickness can be used and various energies for implantation schedules can be used. It is therefore to be understood that within the scope of the appended claims the invention may be practiced otherwise than as specifically described.

We claim:

1. A method for ion implanting using multiple energy Be+ to produce p-type regions in an n-In$_{0.53}$Ga$_{0.47}$As substrate and thereafter implanting Si in Be-implanted InGaAs epilayers to produce n+-p-n structure which includes the steps of:
   implanting Be+ in said n-InGaAs substrate;
   annealing Be+ implanted n-InGaAs substrate; and
   implanting Si in Be+ implanted n-InGaAs substrate.

2. The method of claim 1 wherein the step of implanting Be+ in said n-InGaAs further includes using multiple Be+ energy ions to obtain different types of p-type layers.

3. The method of claim 2 wherein the step of annealing further includes sandwiching the implanted InGaAs between two pieces of mechanically lapped InAs.

4. The method of claim 3 wherein the step of annealing further includes using a mixture of argon and hydrogen as a forming gas during the annealing.

5. The method of claim 4 which further includes the step of plating Au-Zn-Au on n+-p-n structure to form ohmic contact to the p-type material.

* * * * *